United States Patent
Horng et al.

(10) Patent No.: US 6,871,702 B2
(45) Date of Patent: Mar. 29, 2005

(54) HEAT DISSIPATOR

(75) Inventors: Alex Horng, Kaohsiung (TW);
Tsung-Min Hsieh, Fengshan (TW);
Wen-Chuan Kung, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 81 days.

(21) Appl. No.: 10/624,562

(22) Filed: Jul. 23, 2003

(65) Prior Publication Data

US 2004/0108100 A1 Jun. 10, 2004

(30) Foreign Application Priority Data

Nov. 20, 2002 (TW) .................................. 91219096 U

(51) Int. Cl.⁷ .............................................. H05K 7/20
(52) U.S. Cl. ................. 165/104.33; 165/121; 165/80.3; 361/697; 361/700
(58) Field of Search .............................. 165/80.3, 80.4, 165/104.21, 104.33, 121, 185; 361/697, 700

(56) References Cited

U.S. PATENT DOCUMENTS

| 6,399,877 | B1 | * | 6/2002 | Sakamoto | 174/16.3 |
| 6,408,934 | B1 | * | 6/2002 | Ishida et al. | 165/80.3 |
| 6,487,076 | B1 | * | 11/2002 | Wang | 361/697 |
| 6,542,364 | B2 | * | 4/2003 | Lai et al. | 361/697 |
| 6,702,002 | B2 | * | 3/2004 | Wang | 165/80.3 |
| 6,712,129 | B1 | * | 3/2004 | Lee | 165/104.21 |
| 6,771,497 | B2 | * | 8/2004 | Chen et al. | 361/687 |

FOREIGN PATENT DOCUMENTS

| JP | 11045967 A | * | 2/1999 | H01L/23/467 |
| JP | 2002280505 A | * | 9/2002 | H01L/23/427 |

* cited by examiner

Primary Examiner—Allen J. Flanigan
(74) Attorney, Agent, or Firm—Bacon & Thomas PLLC

(57) ABSTRACT

A heat dissipator includes a base and a plurality of connecting portions formed thereon. The base is further combined with a fan provided with a plurality of air outlets. The connecting portions are adapted to mount a heat-generating member and a heat-conducting module. The heat-conducting module includes a heat-conducting plate attached to a surface of the heat-generating member, and a heat-conducting tube mounted thereon. The heat-conducting tube is bent to form two extensions having an appropriated included angle therebetween. Each of the extensions of the heat-conducting tube is connected with a plurality of fins, which are positioned and thus aligned with the air outlets of the fan.

8 Claims, 5 Drawing Sheets

HEAT DISSIPATOR

FIELD OF THE INVENTION

The present invention relates to a heat dissipator for a CPU of a computer, and more particularly to a heat dissipator for a CPU of a computer which has an increase of a heat-dissipating area and thereby enhancing heat-dissipating efficiency.

BACKGROUND OF THE INVENTION

Referring initially to FIG. 1, a heat dissipator 90 for a CPU of a computer in accordance with the prior art includes a heat-conducting tube 92 adherently attached on a CPU 91 (central processing unit), extending downward to connect with a plurality of fins 93. The heat dissipator 90 further includes a cooling fan 94 which drives airflow from an air outlet 95 through the fins 93 to thereby discharge it so as to remove the heat generated from the CPU.

Since the heat-conducting tube 92 of the conventional heat dissipator 90 is only disposed on one side of the CPU 91, the number of fins 93 connected with the heat-conducting tube 92 are inevitably limited. Further, since the cooling fan 94 has only one limited air outlet 95 to blow on the fins 93, the heat generated from the CPU 91 therefore cannot be effectively removed.

SUMMARY OF THE INVENTION

Accordingly, the primary object of the present invention is to provide a heat dissipator which has an enlarged heat dissipating area and a more efficient means for removing heat therefrom so as to enhance heat dissipating efficiency.

The heat dissipator in accordance with the present invention includes a base and a plurality of connecting portions formed thereon. The base is further combined with a fan provided with a plurality of air outlets. The connecting portions are adapted to mount a heat-generating member and a heat-conducting module. The heat-conducting module includes a heat-conducting plate attached to a surface of the heat-generating member, and a heat-conducting tube mounted thereon. The heat-conducting tube is bent to form two extensions having an appropriated included angle therebetween. Each of the extensions of the heat-conducting tube is connected with a plurality of fins, which are positioned and thus aligned with the air outlets of the fan.

The various objects and advantages of the present invention will be more readily understood from the following detailed description when read in conjunction with the appended drawing.

DESCRIPTION OF THE PREFERREND EMBODIMENTS

The preferred embodiments according to the present invention are described below in conjunction with the appended figures.

Figure 1:
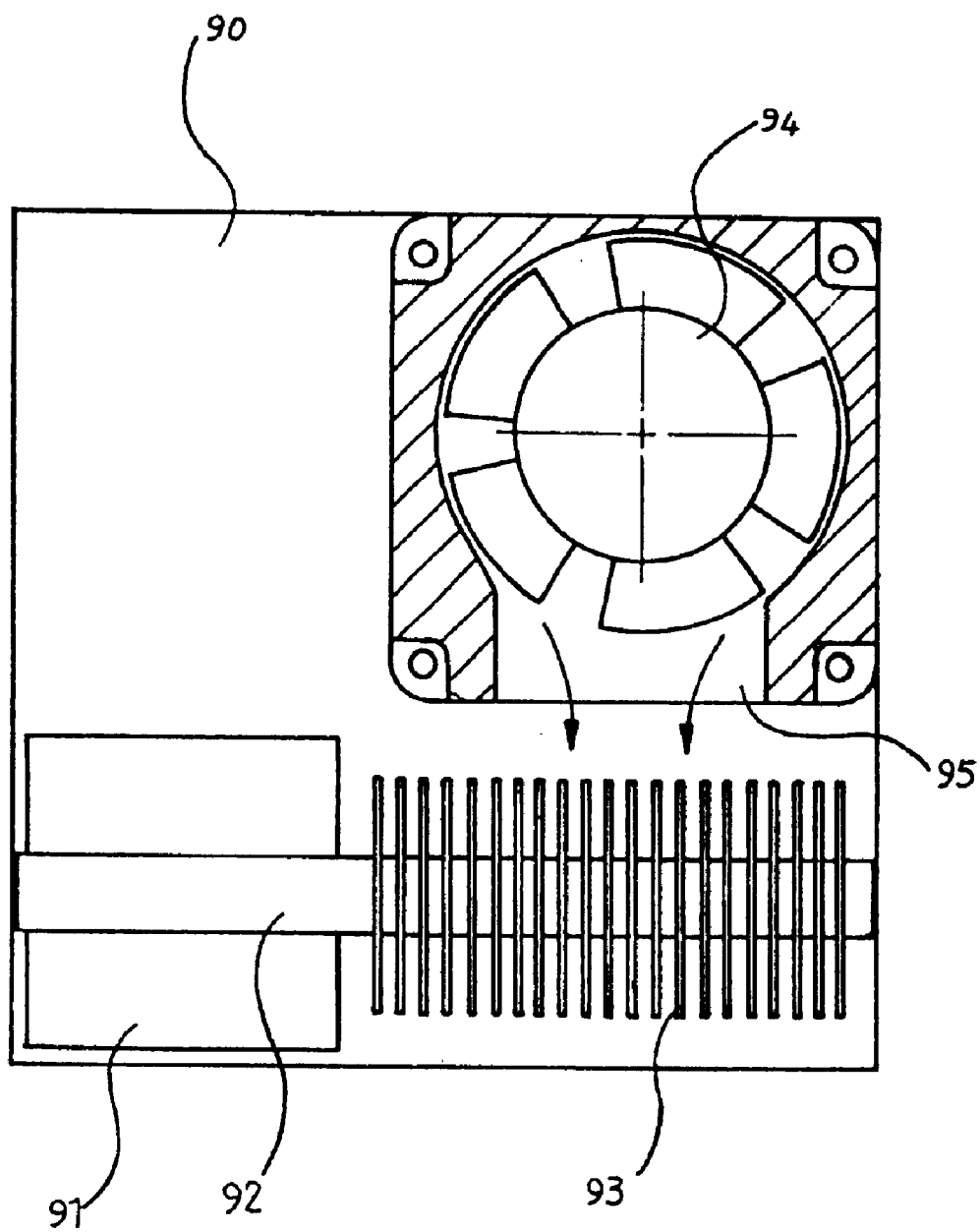
FIG. 1 is a top view of a conventional heat dissipator for a CPU of a computer.
Figure 2:
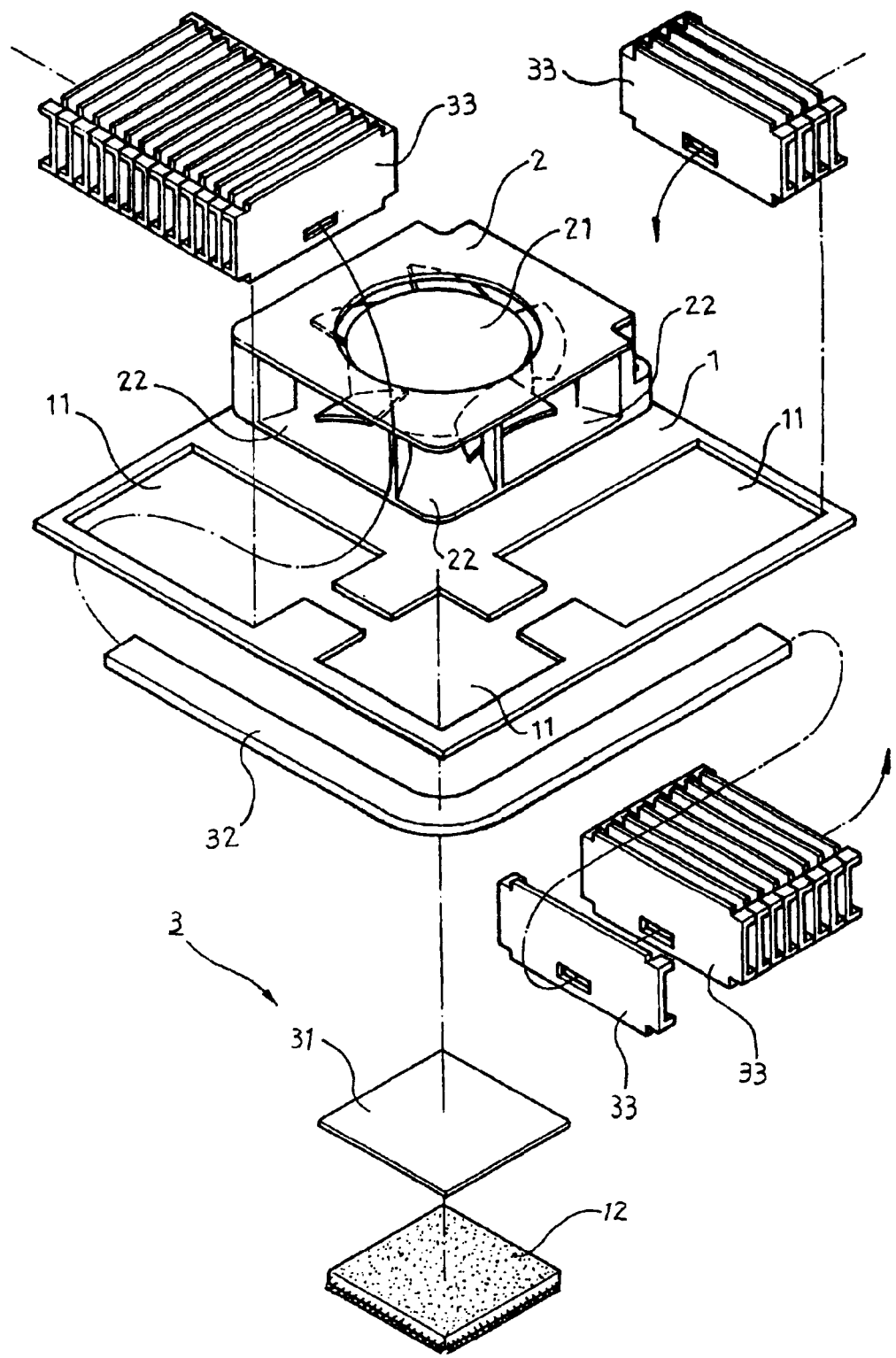
FIG. 2 is an exploded perspective view of a heat dissipator in accordance with the first preferred embodiment of the present invention.
Figure 3:
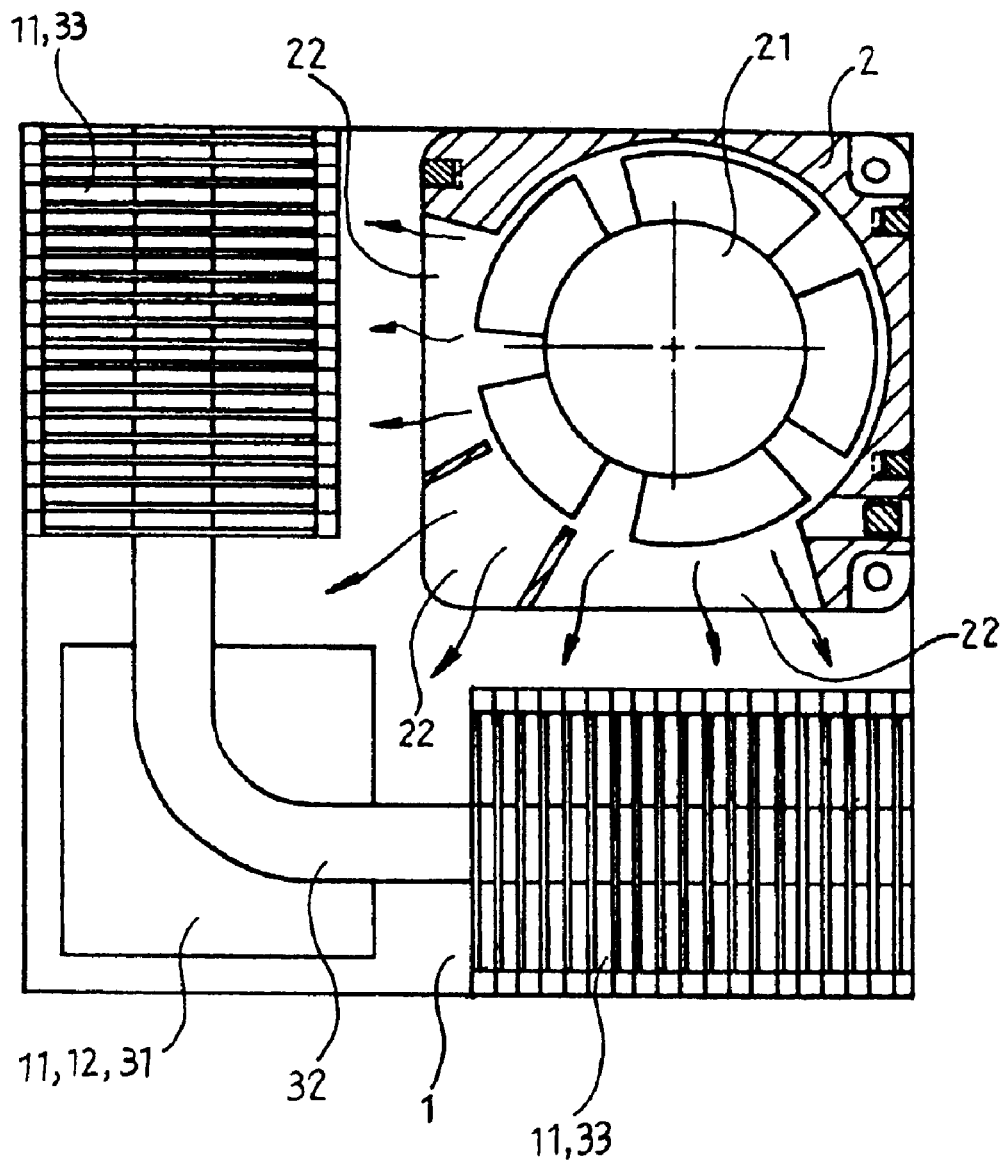
FIG. 3 is a top view of the heat dissipator in accordance with the first preferred embodiment of the present invention in assembled state.

Referring to FIGS. 2 and 3, the heat dissipator in accordance with the first preferred embodiment of the present invention mainly comprises a base 1, a fan 2 and a heat-conducting module 3.

The base 1 includes a plurality of connecting portions 11 for connecting with the heat-conducting module 3, and a heat-generating member 12, such as a CPU. A heat-conducting plate 31 is adherently attached to the top surface of the heat-generating member 12. The connecting portions 11 are practically sunken areas on the base 1, which provide a better fixing effect for locating the heat-generating member 12 and the heat-conducting module 3. The settlement of the heat-generating member 12 and the heat-conducting module 3 in the sunken portions on the base 1 also result in a decrease of the entire thickness of the heat dissipator.

The fan 2, a conventional cooler, is fixed on the base 1. A fan wheel 21 accommodated within the fan 2 drives airflow through air outlets 22 which are located on two adjacent lateral sides of the fan 2. Two air outlets 22 are correspondingly aligned with fins located at two extensions of the heat-conducting module 3.

The heat-conducting module 3 includes a heat-conducting plate 31 and a heat-conducting tube 32, wherein the heat-conducting plate 31 is adherently attached to the heat-generating member 12, and the heat-conducting tube 32 is attached onto the heat-conducting plate 31. The heat-conducting plate 31 is made of thermal conductive material and has two adjacent lateral sides from which the heat-conducting tube 32 is extended. In this preferred embodiment, two extensions of the heat-conducting tube 32 have a predetermined included angle, such as a right angle, formed therebetween. The extensions of the heat-conducting tube 32 are disposed on the two air outlets 22 and combined with a plurality of fins 33 that constitutes a heat sink for heat dissipation purpose.

Referring to FIG. 3, it shows a top view of the assembled state of the present invention. The heat-conducting plate 31 of the heat-conducting module 3 is adherently connected with the heat-generating member 12 that is mounted on the base 1. Each of the two extensions of the heat-conducting tube 32 of the heat-conducting module 3 is connected with the fins 33 and conducted heat thereto. The air outlets 22, formed on two lateral sides of the fan 2, are arranged to face the fins 33 at the extensions of the heat-conducting tube 32. Therefore, the airflow, driven by the fan wheel 21 and exhausted from the air outlet 22 removes the heat that is generated from the heat-generating member 12 and conducted through the heat-conducting plate 31 and the heat-conducting tube 32 to the fins 33. Since the conducting plates 33 of the present invention provide an enlarged heat-dissipating area than that of the conventional heat dissipator and the conducting plates 33 are arranged on the air outlet 22 of the fan 2, the efficiency of heat dissipation is increased.

Figure 4:
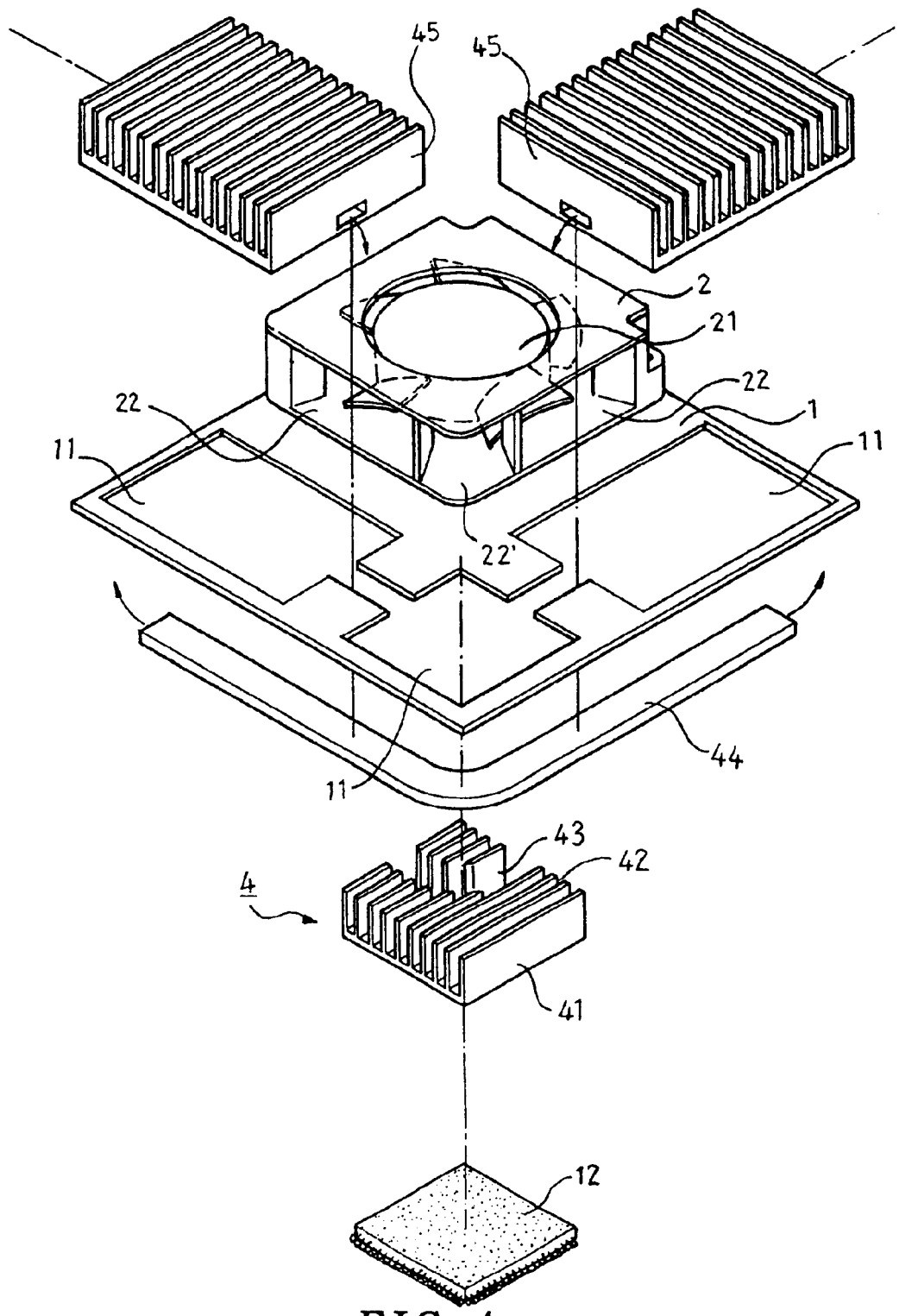
FIG. 4 is an exploded perspective view of a heat dissipator in accordance with the second preferred embodiment of the present invention.

Referring to FIG. 4, it illustrates the second preferred embodiment according to the present invention which comprises a base 1, a fan 2 and a heat-conducting module 4.

A plurality of connecting portions 11 is formed on the base 1 for mounting a heat-generating member 12 and the heat-conducting module 4. The fan 2, mounted on the base 1, accommodates a fan 21 to drive airflow outwardly through air outlets 22 formed on two adjacent lateral sides thereof.

In the second preferred embodiment, the heat-conducting module 4 includes a heat-conducting plate 41 and a heat-conducting tube 44, wherein the bottom surface of the heat-conducting plate 41 is adherently connected with the top surface of the heat-generating member 12. The heat-conducting plate 41 is made of heat conductive material and a plurality of fins 42 are extended therefrom. The fins 42 define a curved channel 43 for allowing a curved section of the heat-conducting tube 44 extended therethrough. The heat-conducting tube 44 has two extensions arranged with a cross relationship on the top surface of the heat-generating member 12. The two extensions have a predetermined included angle, such as a right angle. Two extensions are disposed to align with the air outlets 22 of the fan 2 and each of which connected with a plurality of fins 45 that constitute a heat sink for heat dissipation purpose.

Figure 5:
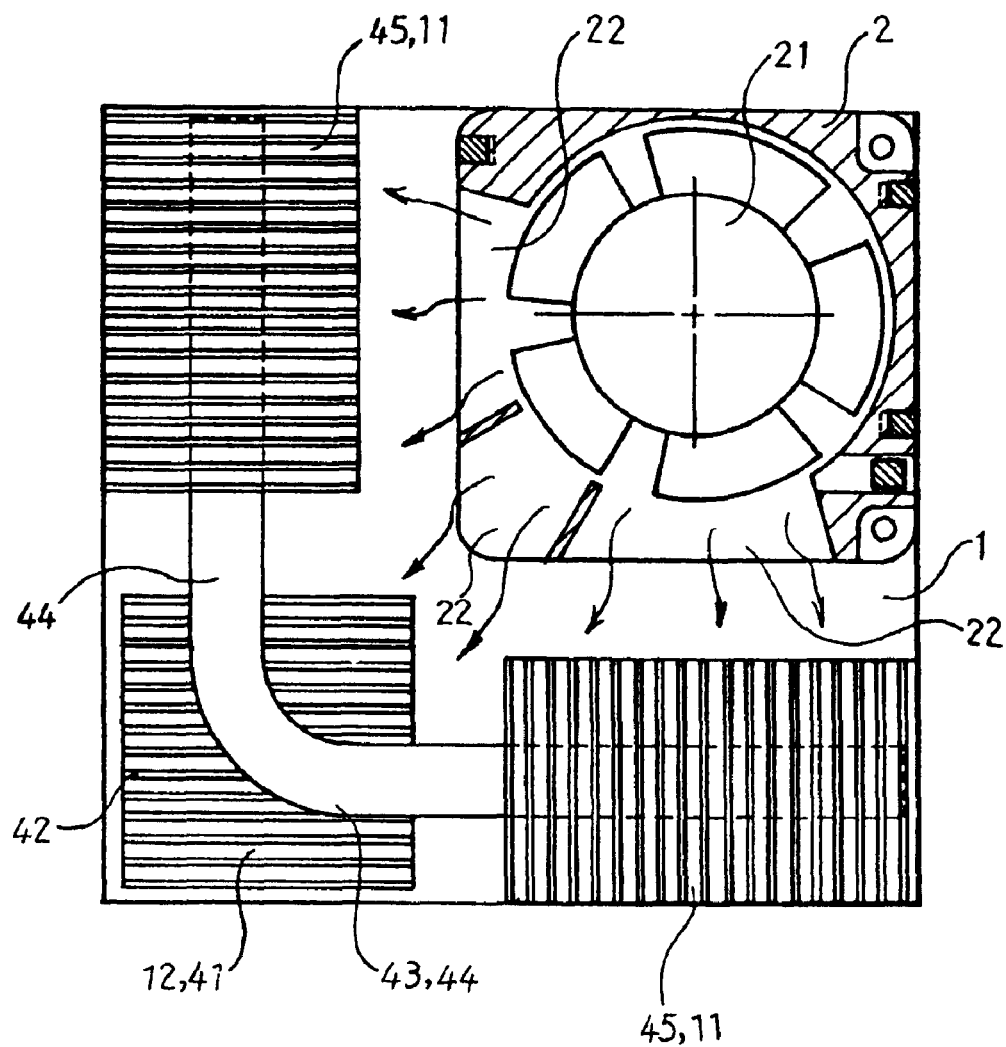
FIG. 5 is a top view of the heat dissipator in accordance with the second preferred embodiment of the present invention in assembled state.

Referring to FIG. 5, it shows the assembled state of the heat dissipator in accordance with the second preferred embodiment of the present invention. The heat-conducting plate 41 of the heat-conducting module 4 is adherently mounted on top surface of the heat-generating member 12 of the base 1. The heat-conducting tube 44 is attached to the heat-conducting plate 41 and each of the two extensions is further connected with a plurality of fins 45. Since the air outlet 22 of the fan 2 are aligned with the fins 45, the airflow is able to remove the heat that is generated from the heat-generating member 12 and conducted through the heat-conducting plate 41 and the heat-conducting tube 44 to the fins 45. Consequently, the total heat dissipating area of the fins 42 and 45 is significantly greater than that of the conventional heat dissipator and thus the efficiency of heat dissipation is increased.

Because of the greater heat dissipation area and the widen dimensions of the air outlets, it result in an increase of the air flow driven by the fan and thus the efficiency of heat dissipation is increased.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipator providing a heat-dissipation means for a heat-generating member, comprising:
    a fan accommodating a fan wheel for driving airflow to exhaust through a plurality of air outlets formed therewith; and
    a heat-conducting module including a heat-conducting plate and a heat-conducting tube, said heat-conducting tube formed with two extensions, said two extensions having a predetermined included angle, each of said extensions connected with fins, said fins being aligned with one of said air outlets.

2. The heat dissipator of claim 1, wherein said heat-conducting plate attached to a top surface of said heat-generating member.

3. The heat dissipator of claim 2, wherein said heat-conducting tube is extended from two corresponding lateral sides of said heat-conducting plate on said heat-generating member.

4. The heat dissipator of claim 1, further comprising a plurality of connecting portions formed on said base for mounting said heat-generating member, said heat-conducting module and said fan.

5. The heat dissipator of claim 1, wherein the two extensions of the heat-conducting tube have a predetermined included angle of 90 degrees.

6. The heat dissipator of claim 1, wherein said air outlets of said fan are located on adjacent lateral sides thereof.

7. The heat dissipator of claim 1, wherein said heat-conducting plate has a bottom surface connected with said heat-conducting member, and a top surface extended a plurality of fins.

8. The heat dissipator of claim 7, wherein a curved channel is formed among said fins to receive said heat-conducting tube.

* * * * *